US008194502B1

(12) United States Patent
Croft, III

(10) Patent No.: US 8,194,502 B1
(45) Date of Patent: Jun. 5, 2012

(54) VARIABLE DIRECTIVITY LOUD HAILING DEVICE

(75) Inventor: James J. Croft, III, San Diego, CA (US)

(73) Assignee: LRAD Corporation, San Diego, CA (US)

( * ) Notice: Subject to any disclaimer, the term of this patent is extended or adjusted under 35 U.S.C. 154(b) by 1092 days.

(21) Appl. No.: 12/100,000

(22) Filed: Apr. 9, 2008

Related U.S. Application Data

(60) Provisional application No. 60/922,689, filed on Apr. 10, 2007.

(51) Int. Cl.
*H03G 5/00* (2006.01)

(52) U.S. Cl. ....... 367/138

(58) Field of Classification Search ....... 367/138, 367/139; 381/77, 98, 387
See application file for complete search history.

(56) References Cited

U.S. PATENT DOCUMENTS

| | | | | |
|---|---|---|---|---|
| 5,923,617 | A * | 7/1999 | Thompson et al. | 367/138 |
| 6,229,899 | B1 | 5/2001 | Norris et al. | |
| 6,359,990 | B1 | 3/2002 | Norris | |
| 6,594,201 | B2 | 7/2003 | Barnard et al. | |
| 6,678,381 | B1 | 1/2004 | Manabe | |

* cited by examiner

*Primary Examiner* — Daniel Pihulic

(74) *Attorney, Agent, or Firm* — Thorpe North & Western LLP

(57) ABSTRACT

A system and method for varying the directionality of an acoustic output of a loud hailing and warning device is disclosed. The method includes the operation of placing a sliding high-pass filter in a signal path of a transducer array having a frequency-dependant dispersion characteristic. A control is provided that varies a lower cutoff frequency of the sliding high-pass filter. The lower cutoff frequency of an electronic audio signal is variably controlled and sent to the transducer array to variably control the directionality of the acoustic output of the loud hailing and warning device.

20 Claims, 3 Drawing Sheets

VARIABLE DIRECTIVITY LOUD HAILING DEVICE

PRIORITY CLAIM

Priority is claimed to U.S. Provisional Patent application Ser. No. 60/922,689, filed Apr. 10, 2007, which is hereby incorporated by reference in its entirety.

BACKGROUND

In hailing and warning, as well as intent determination and behavior modification using high sound pressure level (SPL) output devices, it is sometimes desirable that the output be narrowly directed to a specific location or individual, and sometimes that it be widely spread out toward a large area or directed to a large group of individuals. Typically these are incompatible goals in a single device, as dispersion is usually considered a fixed characteristic of a loudspeaker or group of loudspeakers. Therefore, the device is usually designed to be more directional, or it is designed to cover a wide area, but not both.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein.

DETAILED DESCRIPTION OF EXAMPLE EMBODIMENTS

Reference will now be made to the exemplary embodiments illustrated, and specific language will be used herein to describe the same. It will nevertheless be understood that no limitation of the scope of the invention is thereby intended.

Figure 1:
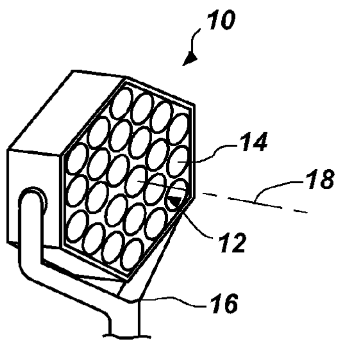
FIG. 1 is a perspective view of an example loud hailing and warning device having an array of transducers carried by a pan and tilt support allowing aiming of the audio output of the array.

With reference to FIG. 1, an example loud hailing device 10 comprises an array 12 of transducers 14 carried by a support 16 allowing aiming output along an acoustic axis 18. As used herein, a loud hailing device is a device that is operable to output waves with a sound pressure level (SPL) of greater than 140 dB, as measured at a distance of 1 meter from the device. The loud hailing device can also be operable to direct the acoustic waves along a relatively narrow path.

The transducers can be of uniform type and size, or of different sizes and/or types. For example, the transducers in the array can include piezoelectric transducers, compression transducers, planar magnetic transducers, or conventional drivers. Each of the transducers may be coupled to an acoustic horn to provide impedance matching between the transducer and air. The acoustic horn or other type of waveguide can also be used to provide directional characteristics to the acoustic output of each transducer. The type of transducer, or mixture of types, is selected to provide a desired frequency range for the array. This can include higher frequency capability for producing a directed acoustic beam and lower frequency capability for carrying the acoustic output long distances. It will be appreciated that lower frequencies will typically produce wider dispersion than higher frequencies, for an array having the same array size and geometrical configuration because dispersion is frequency dependent for a given transducer or array.

An array 12 of transducers will be described in the examples, but other suitable arrangements for loud hailing having a directional characteristic, such as the use of a single transducer, are also contemplated. In one embodiment, a number of separate devices, each having at least some directionality, can be employed. For example, a group of devices, each held by a separate individual person, or mounted on separate supports—but directed with respect to the acoustic axis 18 in a coordinated way—is contemplated in a later example. The functionality described below can be implemented using these example devices, as well as a single device incorporating an array of transducers. For simplicity of presentation, however, a single array will be discussed to illustrate the relevant concepts. Moreover, for purposes of this disclosure and claim of rights with respect to the patentable invention(s) discussed therein, the term "device" is defined as one device or a group of devices acting in a coordinated way to produce an acoustic output. In any case, generally speaking the output will be more directional with increasing frequency and less so as the frequency is decreased.

Figure 2:
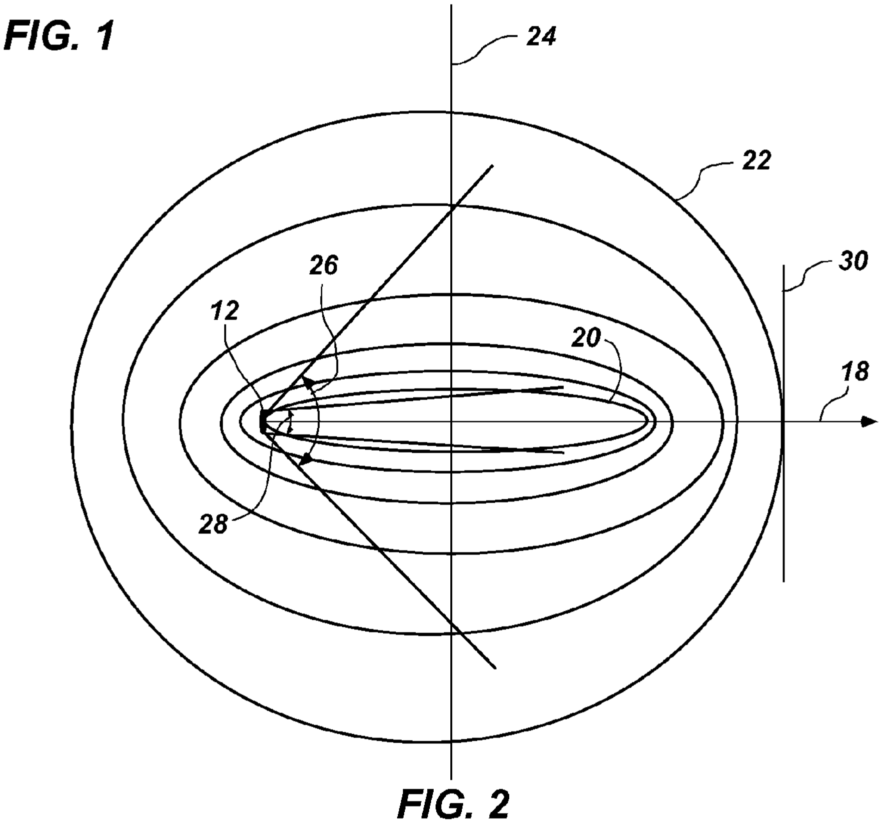
FIG. 2 is a diagram showing several equal output level polar plots of output from an example loud hailer array superimposed with schematic representations of beam spread variation with frequency range of the output.

A stylized representation of various frequencies of acoustic output from an array 12 of a given size and configuration having substantially equal sound pressure level (SPL) output over these frequencies is illustrated in FIG. 2. Dispersion from the acoustic axis 18 is relatively small for high frequencies that emit in a "beamed" pattern 20, thereby providing a substantially directional acoustic output characteristic. Conversely, for lower frequencies dispersion can be considerably greater. This is illustrated by the outer dispersion pattern 22 shown in the figure corresponding to a lower frequency band output. As will be appreciated, at a first given distance 24 along the acoustic axis, lower frequencies will cover the wider spread 26. Whereas the more directional output having a narrower output spread 28 is enabled if the frequency is held high enough to limit the dispersion. Again, this assumes the same transducer array 12 has the same size, shape, amplifier(s) power handling, and so forth in both the high frequency and low frequency cases. In one embodiment, the spot beam width of the narrower output spread can be less than 30 degrees.

Lower frequency sound can typically carry farther in air due to less conversion loss to heat as the waves propagate, compared with higher frequencies of the same output level. Speech can be more intelligible at a second given distance 30 along the acoustic axis 18 if the lower frequencies reach the second given distance 30. Therefore, it can be beneficial in some instances to maximize the output of low frequency tones from the array 12. For example, when communicating over substantial distances, the use of low frequencies can allow the speech to be correctly discerned at greater distances. In other situations, it may be beneficial to more tightly control the beam width of the acoustic output from the array. This can be accomplished by limiting the low frequency output, thereby enabling the higher frequencies with the narrower spread 28 to be sent in a more directional pattern.

The amount of dispersion of the acoustic output from the transducer array can be controlled by providing a sliding high-pass filter in the audio signal path to the device 10 which can controllably limit the output frequency range of the electronic audio signal. With reference to the example illustrated in FIG. 3, the frequency response curve 32 for an array 12 is made adjustable by providing a sliding high pass filter characteristic that is controllable by an operator of the device. The low-end cutoff frequency portion 34 of the curve can be shifted up and down as illustrated by the dashed lines representing response variation with alteration of the high pass filter characteristic. As used herein, the cutoff frequency is the frequency at which the sound pressure level (SPL) at the acoustic output of the transducer array has decreased by 3 dB, as measured at a distance of 1 meter from the array.

Figure 3:
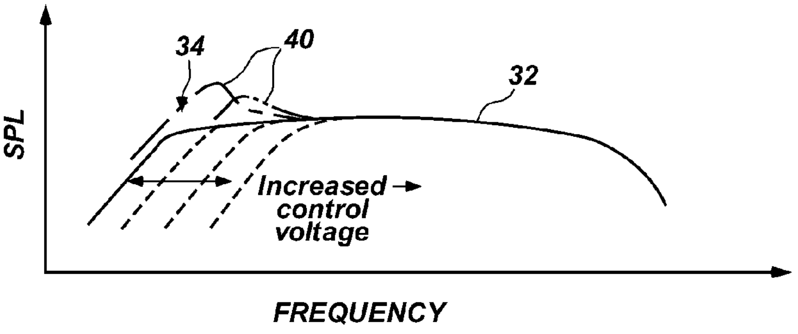
FIG. 3 is a plot of sound pressure level vs. frequency illustrating response of an example device, wherein variation in the lower cutoff frequency is depicted by a series of dashed lines, and a possible feature of bass response boost by gain adjustment is shown in outline in accordance with an embodiment of the present invention.
Figure 4:
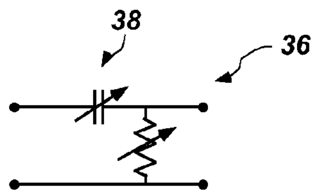
FIG. 4 is a simplified schematic diagram illustrating a sliding high pass filter in accordance with an exemplary embodiment of the present invention.

With reference to FIGS. 3 and 4, in one example a very simple high-pass filter 36 scheme using a variable capacitance element 38 and a resistive element 40 (which can also be variable) is shown. The capacitor and resistor can be configured as an alternating current voltage divider and can be placed between an electronic audio signal source and amplification (not shown). Alternatively, the filter 36 can be located after a pre-amplifier and before a large gain amplification (again, not shown). By varying the values of the capacitor and/or resistor elements, the low frequency cutoff 34 (FIG. 3) can be shifted to lower or higher frequencies. This can be presented to an operator as simply as a dial to turn, or slide control an operator manipulates, to vary the spread of the output beam by moving the cutoff frequency 34 up and down.

Figure 5:
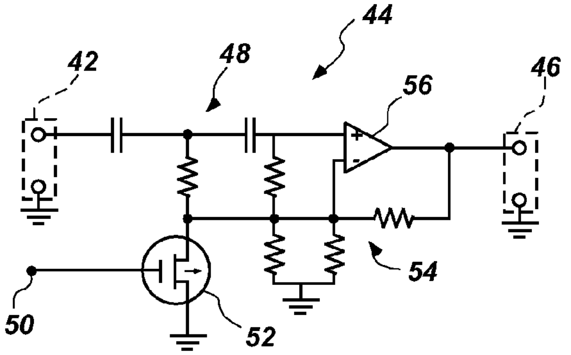
FIG. 5 is a simplified schematic diagram illustrating a sliding high pass filter having a high bass boost in accordance with an embodiment of the present invention.

With reference to FIGS. 3 and 5, in another example, a more sophisticated beam spreading control scheme can include the capability to boost the lower frequency response 40 as well as shift the cutoff frequency, as shown in outline in the plot of FIG. 3. This example includes a control scheme where an audio signal received at an input 42 from (for example) a preamplifier (not shown) is conditioned by the control circuit 44 to produce the desired frequency response and frequency range characteristic at an output 46 connectable to an amplification circuit (not shown) of the device 10.

A high-pass filter 48 can be configured to have a shiftable lower cutoff frequency 34 (FIG. 3) by variation of the voltage of a control signal received at a control input 50 within a range appropriate to produce a desired potential drop from the L-section through a field effect transistor (FET) 52 to ground. The resistor values in a network 54 and the parameters of an operational amplifier 56 connected as shown are chosen to give the desired boost characteristics for the lower frequency range 40 (FIG. 3). The boost at the lower frequency range can be used to extend a substantially flat response further down in frequency or to actually raise the sound pressure level of the lower frequency response (as shown in the outline plots of the boosted response 40). As shown, the boost characteristic can change somewhat as the cutoff frequency is shifted. Again the control voltage applied can be varied by as simple a means as a dial or slider connected to a variable active or passive component within the high-pass filter, as previously described.

The boost of the audio output at lower frequencies, as mentioned above, can have at least two advantages. First, it can enable an extension of the audio output range distance since the low frequency portion of the audio output can travel farther in an air propagation medium. Second, boosting the audio output at lower frequencies can emphasize the harmonics of audio signal components which are lower frequency than the cutoff frequency. The harmonics of the audio signal components are present in the input signal, but are not well reproduced in the array 12 output.

Boosting the lower frequency harmonics can also be used to produce a psychoacoustic bass effect. By more strongly emphasizing the harmonics of the missing (weakly reproduced) low frequency signal components, a typical listener's brain and auditory sensing system will “fill in” the missing lower frequency components in subjectively perceiving the audio signal. This psychoacoustic effect occurs because the brain and auditory sensing system of humans tends to assume the fundamental when it perceives the harmonics related to the fundamental.

Other ways of providing a sliding high-pass filter characteristic in the audio signal path will be known or readily available to be referred to by those skilled in the art from known and accessible published sources. The disclosed examples are simplified and illustrative, and by no means limiting of the ways in which it can be done.

Figure 6:
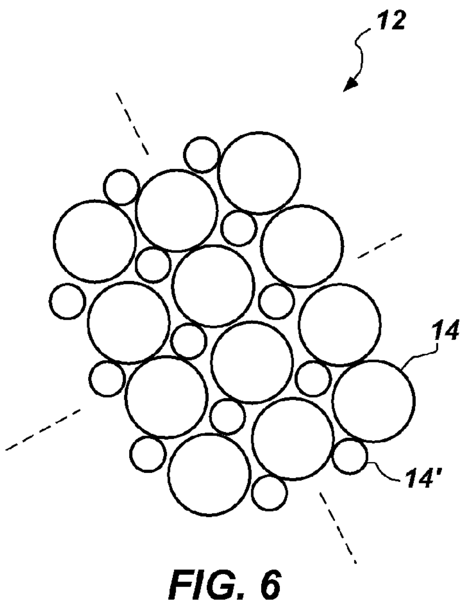
FIG. 6 is a front view schematic representation of a transducer array in one example embodiment of the present invention.

Additional methods also exist to cause a change in frequency response. For example, consider the array configuration shown in FIG. 6. Here, transducers 14 and 14' of the array 12 are of two or more different sizes or types. One size or type of transducer can be well adapted to reproduce relatively higher frequencies, while the other is more adapted to lower frequencies. Another way to provide a variable response is to fade one of the transducer types capable of lower frequency response in and out as needed to provide more bass or less bass response from the array as a whole. This technique can also be used to spread or narrow the overall beam output from the array.

Figure 7:
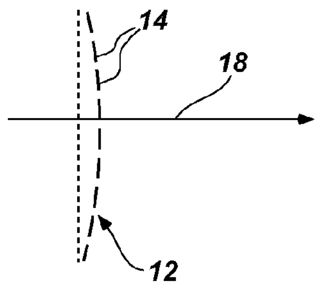
FIG. 7 is a schematical side view representation of a variable geometry transducer array employing multiple transducers each having a directional characteristic in accordance with an embodiment of the present invention.

As illustrated by FIG. 7, another way to alter the dispersion of an audio signal is to physically alter the configuration of the array. For example, by flexing the supporting structure (not shown) of an array 12 of directional transducers 14, the array can be shifted from a flat configuration shown in dashed lines to a curved one shown in solid lines, and vice versa. This will also spread and narrow the output dispersion in response to operator input when the operator is able to control the flex of the array.

Figure 8:
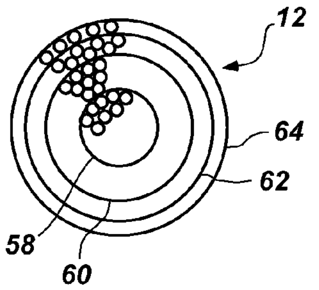
FIG. 8 is a front view schematical representation of an array including transducers in banks arranged concentrically in accordance with a Bessel function.
Figure 9:
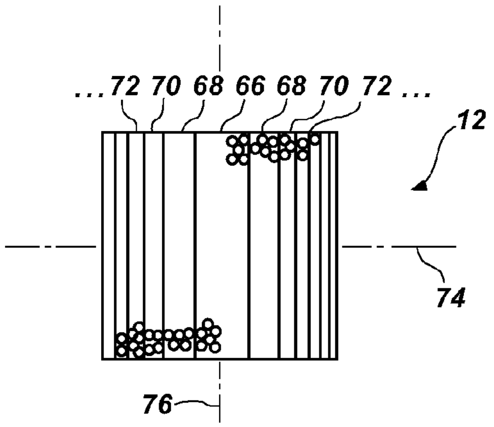
FIG. 9 is a front view schematical representation of an array including transducers arranged in banks symmetrically with respect to a vertical axis in accordance with a Bessel function.

There are other ways to provide a variable dispersion. As illustrated by FIGS. 8 and 9, the array 12 can be configured with banks 58, 60, 62, 64 of transducers arranged concentrically (as illustrated in FIG. 8) or with banks 66, 68, 70, 72 of transducers arranged symmetrically with respect to an axis 76 (as illustrated in FIG. 9). It should be noted that in FIGS. 8 and 9 only a portion of the transducers are shown for clarity of representation of the overall scheme. The arrangement of the transducers are configured to provide a Bessel function focusing effect by varying the phase of the signal sent to alternating banks. Dispersion can be varied by allowing more or less cancellation to occur between the output of the alternating banks of opposite polarity. Typically, the relative phase angle of the signal sent to the respective banks is at or near 180 degrees for the tightest beam, and at or near 0 degrees for widest dispersion. It will be appreciated that output SPL is traded for directionality in these embodiments, as more and more power is lost to cancellation as the beam is tightened up.

The example of FIG. 9 allows variation of dispersion in the plane of one axis 74 while keeping dispersion relatively constant in the plane of the other 76 axis orthogonally disposed to the first axis. This is advantageous in certain circumstances. For example, when vertical dispersion is to be held relatively constant so as not to waste power in energy directed above or below a target, and yet allow the area of the target to be widened or narrowed as desired. This may be used when communicating with or controlling a crowd. The energy can be substantially directed at the crowd in the vertical dispersion of the output from the array 12. The horizontal dispersion can be used to focus the output on more or less people in the crowd, as desired by the operator.

With reference to the examples disclosed previously, these arrangements allow an operator to select the beam characteristic at the output of an array 12 of transducers. The beam characteristics at the output can be selected to cover a wider area or narrower area as desired. In one example embodiment, if the operator is not wearing hearing protection, the beam can be kept narrow and largely projecting forward to enable the operator to be positioned directly behind the array 12 where there is a minimum amount of acoustic energy. If array is remotely operated, or the operator is wearing hearing protection, then the frequency range of the array output can be extended downward to enable the output to be widened to provide more acoustic energy over a wider area to which the output audio signal is directed. Additionally, extending the frequency range downward can extend the range at which the output at a given SPL can be reached along the acoustic axis 18.

It should be noted also that this scheme enables higher power handling on the part of the transducers of the array with higher low-frequency cutoff (which is typical for most transducer types). This mitigates, at least to some extent, the higher absorption attending higher frequency propagation, enabling less loss of range when the output beam is narrowed due to raising the cutoff frequency. The ability to mitigate loss by increasing the low-frequency cutoff provides advantages conventionally requiring two devices that can be obtained in a single device.

Applications of the loud hailing device having a variable low frequency cutoff include: (a) the ability to address individuals or small groups as opposed to large or dispersed groups of individuals, or vice versa; (b) mitigation of the effects of crosswinds, which tend to bend an output off axis 18, by providing a wider beam on target; and (c) allowing selection of range or directionality alternatively as the highest priority in operation of the device 10.

Figure 10:
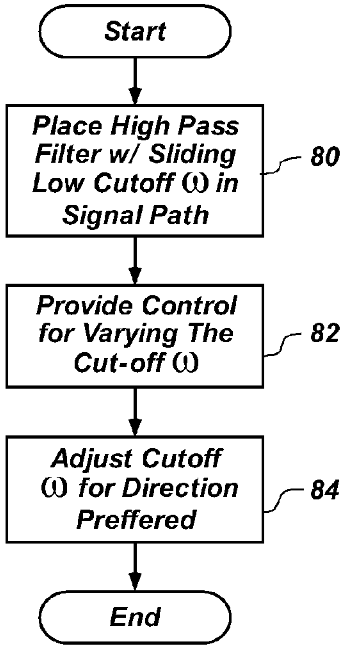
FIG. 10 is a flow chart illustrating an example method for enabling controlling directivity of an output from a loud hailing and warning device in accordance with an embodiment of the present invention.
Figure 11:
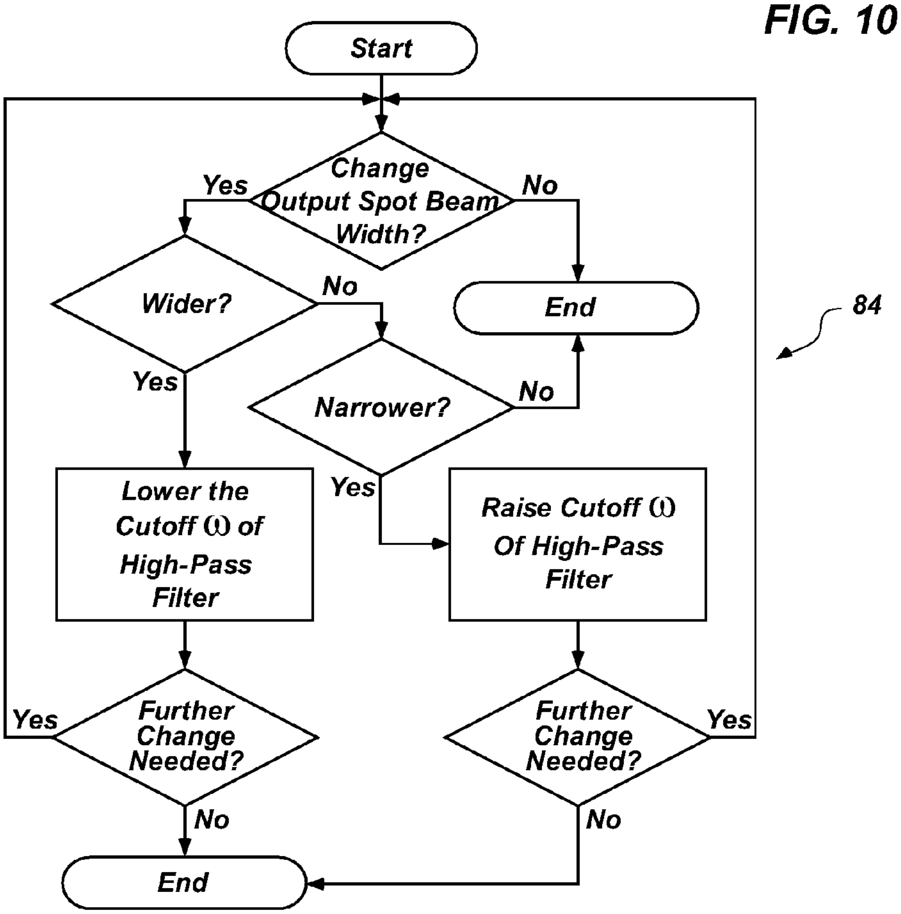
FIG. 11 is a flow chart illustrating an example method of carrying out the adjusting step of FIG. 10 in accordance with an embodiment of the present invention.

A method for enabling variation of directivity is shown by way of example in FIG. 10, where in one step 80 a sliding high pass filter characteristic is provided by placing a high pass filter having a variable low cutoff frequency in the signal path. In another step 82, a control interface to an operator is provided, enabling an operator to selectively vary the directivity of the output from the device (10 in FIG. 1) by altering the low cutoff frequency. In another step 84, the enabled variation of directivity of output is accomplished by adjusting the lower cutoff frequency of the filter. A more detailed diagram of one exemplary adjusting step 84 is shown in FIG. 11. It will be appreciated that numerous variations are possible and will occur to one skilled in the art in possession of this disclosure.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The invention claimed is:

1. A method for varying the directionality of an acoustic output of a loud hailing and warning device, comprising the steps of:

placing a sliding high-pass filter in a signal path of a transducer array having a frequency-dependant dispersion characteristic;

providing a control which varies a lower cutoff frequency of the sliding high-pass filter; and variably controlling the lower cutoff frequency of an electronic audio signal sent to the transducer array to variably control the directionality of the acoustic output of the loud hailing and warning device.

2. A method as in claim 1, further comprising coupling each transducer in the transducer array to an acoustic horn operable to provide directionality and impedance matching of the transducer with air.

3. A method as in claim 1, further comprising selecting each transducer in the transducer array from the group consisting of piezoelectric transducers, compression transducers, and planar magnetic transducers to provide the acoustic output of the transducer array with a desired frequency response.

4. A method as in claim 1, further comprising selecting at least two different sized transducers for the transducer array, wherein each size is selected to provide a desired frequency response in the acoustic output of the transducer array.

5. A method as in claim 1, wherein variably controlling the lower cutoff frequency further comprises decreasing a frequency of the lower cutoff frequency of the electronic audio signal to increase a spot beam width of the acoustic output of the loud hailing and warning device.

6. A method as in claim 1, wherein variably controlling the lower cutoff frequency further comprises decreasing a frequency of the lower cutoff frequency of the electronic audio signal to increase a range of the acoustic output of the loud hailing and warning device for a selected sound pressure level of the acoustic output.

7. A method as in claim 1, wherein variably controlling the lower cutoff frequency further comprises increasing a frequency of the lower cutoff frequency of the electronic audio signal to decrease a spot beam width of the acoustic output of the loud hailing and warning device to provide a more directional output from the loud hailing and warning device.

8. A method as in claim 7, further comprising increasing the frequency of the lower cutoff frequency of the electronic audio signal to provide a spot beam width of less than 30 degrees.

9. A method as in claim 1, wherein providing the control which varies the lower cutoff frequency of the sliding high-pass filter further comprises providing the control that is further operable to increase gain at lower frequencies of the electronic audio signal.

10. A method as in claim 9, further comprising increasing the gain at the lower frequencies of the electronic audio signal to produce a psychoacoustic bass effect in a listener.

11. A method as in claim 1, further comprising varying the directionality of the output, wherein the output from the loud hailing and warning device is greater than 140 dB as measured at a distance of 1 meter in front of the device.

12. An improved loud hailing and warning device comprising:

an array of transducers operable to direct an acoustic output;

a signal path electrically coupled to the array of transducers, wherein the signal path provides an electronic audio signal to the array of transducers to produce the acoustic output;

a variable high-pass filter located along the signal path and configured to vary a lower cutoff frequency of the electronic audio signal; and a control operable to change the lower cutoff frequency of the electronic audio signal to enable a spot beam width of the acoustic output to be controlled.

13. The device of claim 12, wherein the array of transducers further comprises an acoustic horn coupled to each transducer in the array to provide directionality and impedance matching of the transducer with air.

14. The device of claim 12, wherein transducers in the array of transducers are selected from the group consisting of piezoelectric transducers, compression transducers, and planar magnetic transducers to provide the acoustic output of the array of transducers with a desired frequency response.

15. The device of claim 12, wherein transducers in the array of transducers include at least two different sizes, wherein each size is selected to provide a desired frequency response in the acoustic output of the transducer array.

16. The device of claim 12, wherein the control is operable to decrease a frequency of the lower cutoff frequency of the electronic audio signal to increase a spot beam width of the acoustic output of the loud hailing and warning device.

17. The device of claim 12, wherein the control is operable to decrease a frequency of the lower cutoff frequency of the electronic audio signal to increase a range of the acoustic output of the loud hailing and warning device at a selected sound pressure level of the acoustic output.

18. The device of claim 12, wherein the control is operable to increase a frequency of the lower cutoff frequency of the electronic audio signal to decrease a spot beam width of the acoustic output of the loud hailing and warning device to provide a more directional output from the loud hailing and warning device.

19. The device of claim 12, wherein the variable high-pass filter further includes a gain amplification section configured to increase gain at lower frequencies of the electronic audio signal.

20. The device of claim 12, wherein the acoustic output from the loud hailing and warning device is greater than 140 dB as measured at a distance of 1 meter in front of the device.

* * * * *